(12) United States Patent
Jin

(10) Patent No.: US 12,387,773 B2
(45) Date of Patent: Aug. 12, 2025

(54) MAGNETIC RANDOM ACCESS MEMORY CELL AND MEMORY

(71) Applicant: Semiconductor Manufacturing International (Shanghai) Corporation, Shanghai (CN)

(72) Inventor: Jisong Jin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 172 days.

(21) Appl. No.: 18/219,213

(22) Filed: Jul. 7, 2023

(65) Prior Publication Data
US 2024/0274175 A1 Aug. 15, 2024

(30) Foreign Application Priority Data
Feb. 10, 2023 (CN) .......................... 202310103800.5

(51) Int. Cl.
*G11C 11/00* (2006.01)
*G11C 11/16* (2006.01)
*H10N 50/20* (2023.01)
*H10N 50/85* (2023.01)

(52) U.S. Cl.
CPC ........ *G11C 11/161* (2013.01); *G11C 11/1675* (2013.01); *H10N 50/20* (2023.02); *H10N 50/85* (2023.02)

(58) Field of Classification Search
CPC ... G11C 11/161; G11C 11/1675; G11C 11/18; G11C 11/1673; G11C 11/15; G11C 11/1659; G11C 11/1655; G11C 11/1657; G11C 11/4094; G11C 11/54; G11C 11/16; G11C 11/1693; G11C 11/4074; G11C 11/4085; G11C 11/409; H01F 10/3254; H01F 10/325; H01F 10/3286; G06F 3/0605; G06F 3/0616; G06F 3/0659; G06F 3/0679; H01L 21/3105; H10B 61/00; H10B 61/22; H10B 43/20; H10N 50/10; H10N 50/85; H10N 50/80; H10N 50/01; H10N 50/20; H10N 52/80; H10N 52/00; H10N 52/01; H10N 52/101
See application file for complete search history.

(56) References Cited

U.S. PATENT DOCUMENTS 11,056,641 B2 * 7/2021 Tsumita ................. H10N 50/80

* cited by examiner

*Primary Examiner* — Thong Q Le
(74) *Attorney, Agent, or Firm* — Crowell & Moring LLP

(57) ABSTRACT

Provided are a magnetic random access memory cell and a magnetic random access memory. One form of a memory cell includes: a spin-orbit torque (SOT) layer, through which a write current flows when performing a write operation on the magnetic random access memory cell, a direction of the write current being a first direction, and a direction parallel to the SOT layer and perpendicular to the first direction being a second direction; and a magnetic tunnel junction, located on the SOT layer, the magnetic tunnel junction including substructures symmetrical with respect to the second direction, and a magnetic moment direction of the substructure forming an acute included angle with the first direction.

10 Claims, 3 Drawing Sheets

MAGNETIC RANDOM ACCESS MEMORY CELL AND MEMORY

RELATED APPLICATION

The present application claims priority to Chinese Patent Appln No. 202310103800.5, filed Feb. 10, 2023, the entire content of which is incorporated herein by reference.

TECHNICAL FIELD

Embodiments and implementations of the disclosure relate to the field of semiconductor manufacturing, and in particular to a magnetic random access memory cell and a magnetic random access memory.

BACKGROUND

A magnetic random access memory (MRAM) is a nonvolatile magnetic random access memory. The so-called "nonvolatile" means that the memory can be kept intact after the power to the memory is turned off. An MRAM device has the high-speed read/write capability of a static random access memory (SRAM) and the high integration of a dynamic random access memory (DRAM), and generally can be rewritten infinitely. The MRAM device is an "all-kinetic" solid-state memory. Therefore, the MRAM device has promising application prospects, and is expected to dominate the market of next-generation memories.

A spin-orbit torque (SOT) refers to the generation of a spin transfer torque using a charge flow-induced spin current based on spin-orbit coupling (SOC) to regulate the magnetic memory cells. The SOT-based MRAM (SOT-MRAM) overcomes the defects of the STT-MRAM. In particular, due to the separate paths for read and write, the SOT-MRAM has higher read-write speed and lower power consumption than the STT-MRAM. The SOT-MRAM adopts a three-terminal magnetic tunnel junction (MTJ) structure, and has separate paths for read and write, so the write current is greatly reduced, which results in a higher write speed. More importantly, this not only protects the tunneling insulating layer of the MTJ, but also improves the stability of read data. Moreover, since the write path is independent, it can be further optimized. The read current of the SOT MRAM perpendicularly passes through the magnetic tunnel junction (MTJ), but the write current, relying on the current flowing in the material parallel to and adjacent to the free layer, drives the torque generated by the spin orbit effect on their interface to reverse the magnetic moment of the free layer.

However, the performance of MRAMs still needs to be improved.

SUMMARY

A problem to be addressed by the disclosure is to provide a magnetic random access memory cell and a magnetic random access memory to improve the performance of the magnetic random access memory.

To address the above problem, the disclosure provides a magnetic random access memory cell. In one form, a magnetic random access memory cell includes: a spin-orbit torque (SOT), through which a write current flows when performing a write operation on the magnetic random access memory cell, a direction of the write current being a first direction, and a direction parallel to the SOT layer and perpendicular to the first direction being a second direction; and a magnetic tunnel junction, located on the SOT layer, the magnetic tunnel junction including substructures symmetrical with respect to the second direction, and a magnetic moment direction of the substructure forming an acute included angle with the first direction.

In some implementations, the magnetic tunnel junction includes the substructures symmetrical with respect to the second direction, and one ends of the substructures away from each other are bent toward the second direction.

In some implementations, the magnetic random access memory cell further includes: a first bottom plug, located on a bottom of the SOT layer and contacting one end of the SOT layer; and a second bottom plug, located on the bottom of the SOT layer and spaced apart from the first bottom plug, the second bottom plug contacting the other end of the SOT layer, and an arrangement direction of the second bottom plug and the first bottom plug being used for defining the direction of the write current.

In some implementations, the SOT layer is a strip structure extending along the first direction.

In some implementations, the magnetic random access memory cell further includes: a base, located on the bottom of the SOT layer; and a bottom dielectric layer, located between the base and the SOT layer, the first bottom plug and the second bottom plug being located in the bottom dielectric layer.

In some implementations, the magnetic random access memory cell further includes: a top plug, located on a top of the magnetic tunnel junction and electrically connected to the magnetic tunnel junction.

In some implementations, the magnetic random access memory cell further includes: a top dielectric layer, covering the SOT layer and the magnetic tunnel junction, the top plug being located in the top dielectric layer.

In some implementations, a material of the SOT layer includes at least one of tantalum, tungsten, platinum, boron-doped tantalum, platinum-gold alloy, platinum-palladium alloy, bismuth selenide or bismuth antimonide.

In some implementations, the magnetic tunnel junction includes: a free layer, a tunneling layer located on the free layer, and a pinned layer located on the tunneling layer.

The disclosure further provides a magnetic random access memory. In one form, a magnetic random access memory includes: a plurality of magnetic random access memory cells provided by embodiments and implementations of the disclosure.

Compared with the prior art, the technical solutions of embodiments and implementations of the disclosure have the following advantages:

A magnetic random access memory cell provided by embodiments and implementations of the disclosure is provided with the SOT layer and the magnetic tunnel junction located on the SOT layer, the magnetic tunnel junction includes the substructures symmetrical with respect to the second direction, and the magnetic moment direction of the substructure forms an acute included angle with the first direction, so that the magnetic moment direction of the magnetic tunnel junction contains both a magnetic moment component in the first direction and a magnetic moment component in the second direction.

By containing the magnetic moment component in the first direction, it is beneficial to improve the read-write speed of the MRAM. By containing the magnetic moment component in the second direction, the reversal of the magnetic moment of the free layer in the magnetic tunnel junction can be realized simply by using the SOT layer without an external magnetic field. Based on the above, the magnetic random access memory cell provided by embodiments and implementations of the disclosure not only improves the read-write speed of the MRAM, but also realizes the reversal of the magnetic moment of the free layer in the magnetic tunnel junction without an external magnetic field, which contributes to the production and application of the MRAM, simplifies the structure of the MRAM and improves the performance of the MRAM.

A magnetic random access memory provided by embodiments and implementations of the disclosure includes a plurality of magnetic random access memory cells provided by the embodiment of the disclosure that are arranged in an array. In the magnetic random access memory cell, the magnetic tunnel junction includes the substructures symmetrical with respect to the second direction, and the magnetic moment direction of the substructure forms an acute included angle with the first direction, so that the magnetic moment direction of the magnetic tunnel junction contains both a magnetic moment component in the first direction and a magnetic moment component in the second direction.

By containing the magnetic moment component in the first direction, it is beneficial to improve the read-write speed of the MRAM. By containing the magnetic moment component in the second direction, the reversal of the magnetic moment of the free layer in the magnetic tunnel junction can be realized simply by using the SOT layer without an external magnetic field. Therefore, by making the magnetic random access memory include a plurality of magnetic random access memory cells provided by the embodiments of the disclosure that are arranged in an array, the read-write speed of the MRAM is improved, and the reversal of the magnetic moment of the free layer in the magnetic tunnel junction is realized without an external magnetic field, which contributes to the production and application of the MRAM, simplifies the structure of the MRAM and improves the performance of the MRAM.

DETAILED DESCRIPTION

As discussed in the Background, the performance of the current magnetic random access memories still needs to be improved.

Specifically, in an example of an SOT MRAM device, an SOT MRAM typically includes an SOT layer and a magnetic tunnel junction located on the SOT layer, and a write current flows through the SOT layer when performing a write operation on the magnetic random access memory cell.

Referring to FIG. 1, FIG. 1(a), FIG. 1(b) and FIG. 1(c) show schematic structural diagrams of a Type z SOT MRAM, a Type y SOT MRAM and a Type x SOT MRAM. Depending on a magnetic moment direction of the magnetic tunnel junction 40, the SOT MRAMs can be classified into Type x SOT MRAMs, Type y SOT MRAMs and Type z SOT MRAMs.

Figure 1:
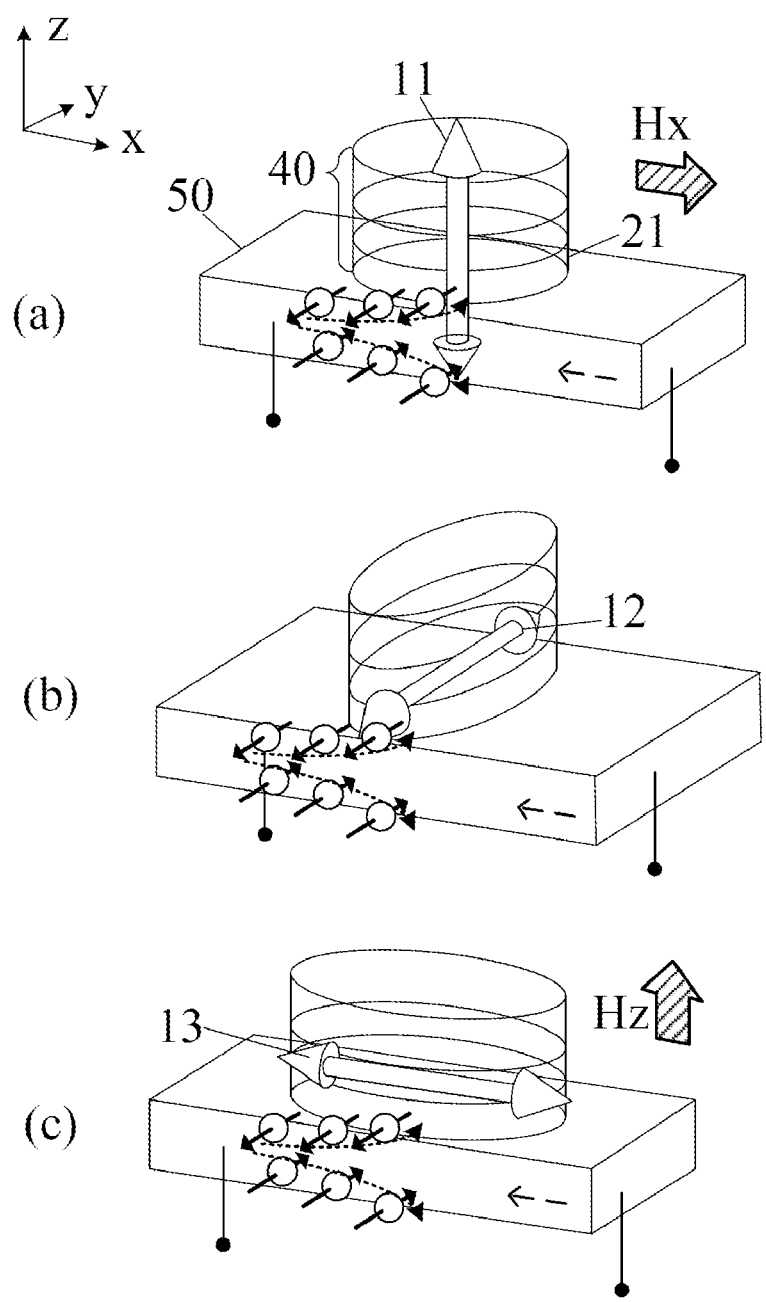
FIG. 1 shows schematic structural diagrams of a Type z SOT MRAM, a Type y SOT MRAM and a Type x SOT MRAM respectively.

As shown in FIG. 1, a magnetic moment direction 13 of the magnetic tunnel junction 40 of the Type x SOT MRAM is parallel to a direction of the write current (x direction in FIG. 1), a magnetic moment direction 12 of the magnetic tunnel junction 40 of the Type y SOT MRAM is perpendicular to the direction of the write current and parallel to a surface of the SOT layer 50, and a magnetic moment direction 11 of the magnetic tunnel junction 40 of the Type z SOT MRAM is perpendicular to the surface of the SOT layer 50.

When performing the write operation, the Type x and Type z SOT MRAMs have high write speed, but need an external magnetic field. As shown in FIG. 1(a) and FIG. 1(c), the Type x SOT MRAM needs an external magnetic field Hz in a z direction, and the Type z SOT MRAM needs an external magnetic field Hx in an x direction, so that the magnetic moment of a free layer 21 of the magnetic tunnel junction 40 can be reversed. However, the external magnetic field may greatly increase the difficulty in actual production and application of SOT MRAMs. As shown in FIG. 1(b), the Type y SOT MRAM does not need an external magnetic field for the write operation, but has a low write speed.

To address the technical problems described above, the disclosure provides a magnetic random access memory cell. In one form, a magnetic random access memory cell includes: an SOT layer, through which a write current flows when performing a write operation on the magnetic random access memory cell, a direction of the write current being a first direction, and a direction parallel to the SOT layer and perpendicular to the first direction being a second direction; and a magnetic tunnel junction, located on the SOT layer, the magnetic tunnel junction including substructures symmetrical with respect to the second direction, and a magnetic moment direction of the substructure forming an acute included angle with the first direction.

The magnetic random access memory cell provided by embodiments and implementations of the disclosure is provided with the SOT layer and the magnetic tunnel junction located on the SOT layer, the magnetic tunnel junction includes the substructures symmetrical with respect to the second direction, and the magnetic moment direction of the substructure forms an acute included angle with the first direction, so that the magnetic moment direction of the magnetic tunnel junction contains both a magnetic moment component in the first direction and a magnetic moment component in the second direction. By containing the magnetic moment component in the first direction, it is beneficial to improve the read-write speed of the MRAM. By containing the magnetic moment component in the second direction, the reversal of the magnetic moment of the free layer in the magnetic tunnel junction can be realized simply by using the SOT layer without an external magnetic field.

Based on the above, the magnetic random access memory cell provided by embodiments and implementations of the disclosure not only improves the read-write speed of the MRAM, but also realizes the reversal of the magnetic moment of the free layer in the magnetic tunnel junction without an external magnetic field, which contributes to the production and application of the MRAM, simplifies the structure of the MRAM and improves the performance of the MRAM.

To make the foregoing objectives, features, and advantages of embodiments and implementations of the disclosure more apparent and easier to understand, specific embodiments and implementations of the disclosure are described in detail below with reference to the accompanying drawings.

Figure 2:
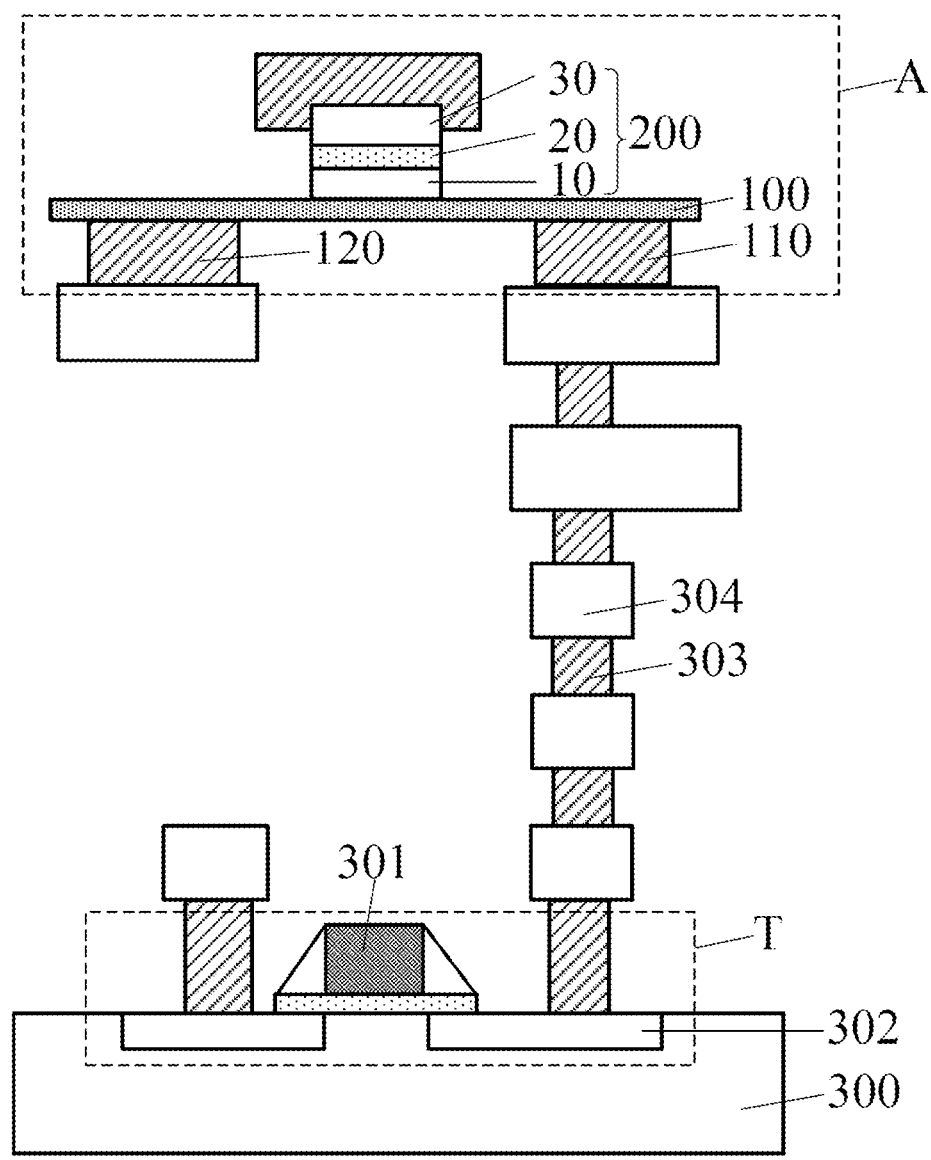
FIG. 2 to FIG. 4 are schematic structural diagrams of one form of a magnetic random access memory cell according to the disclosure.
Figure 3:
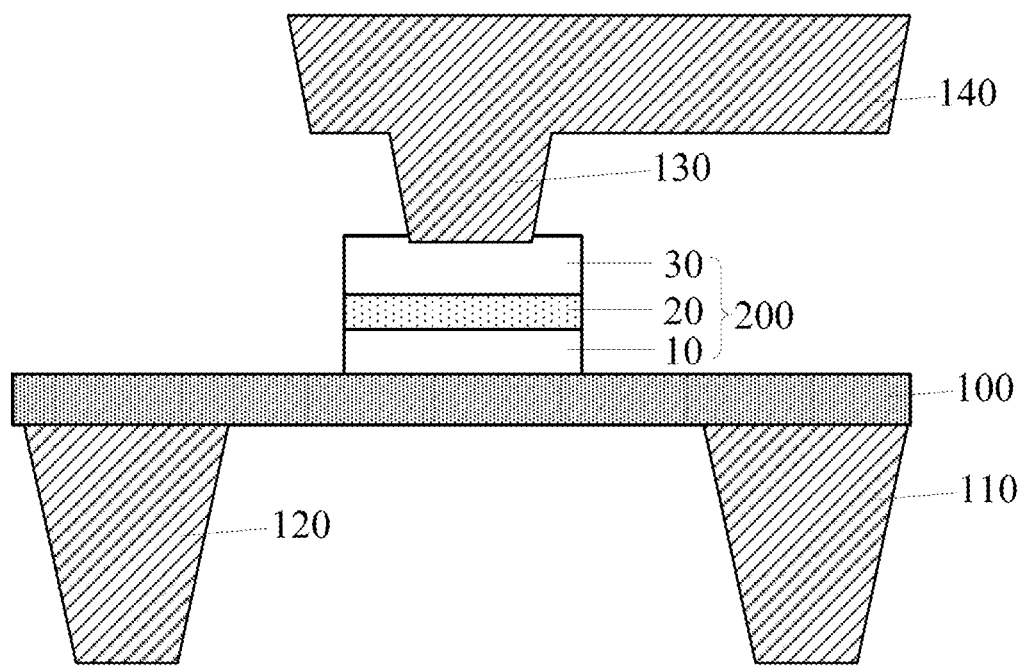
Figure 4:
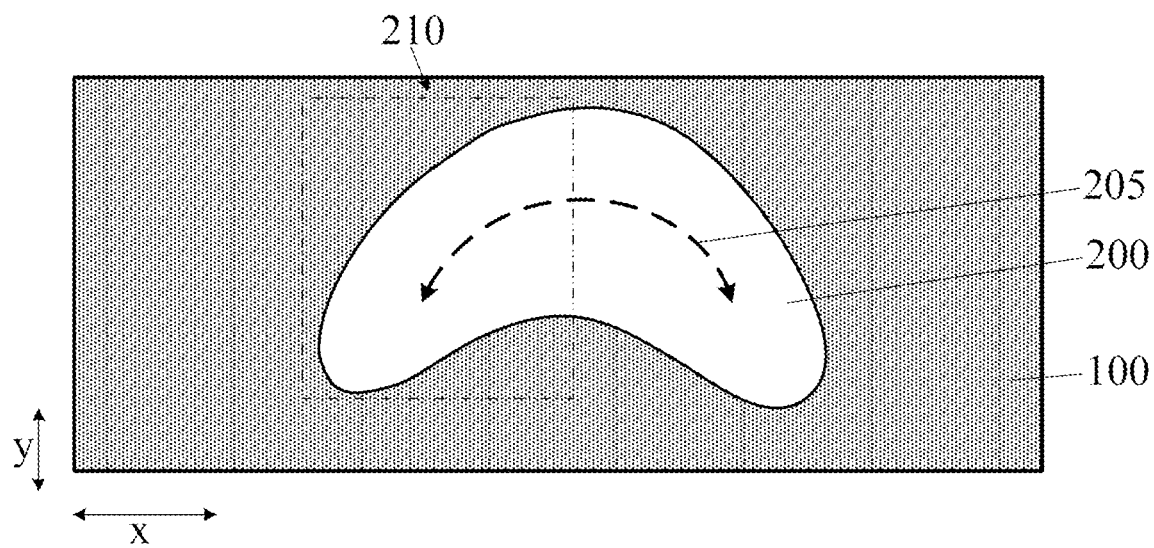

FIG. 2 to FIG. 4 show schematic structural diagrams of one form of a magnetic random access memory cell according to the disclosure. FIG. 2 is a sectional view, FIG. 3 is a partial enlarged view of A in FIG. 2, and FIG. 4 is a top view corresponding to FIG. 3.

As shown in FIG. 2 to FIG. 4, the magnetic random access memory cell includes: an SOT layer 100, a write current flowing through the SOT layer 100 when performing a write operation on the magnetic random access memory cell, a direction of the write current being a first direction (x direction in FIG. 4), and a direction parallel to the SOT layer 100 and perpendicular to the first direction being a second direction (y direction in FIG. 4); and a magnetic tunnel junction 200, located on the SOT layer 100. The magnetic tunnel junction 200 includes substructures 210 symmetrical with respect to the second direction, and a magnetic moment direction (as shown by the dotted arrow 205 in FIG. 4) of the substructure 210 forms an acute included angle with the first direction.

The SOT layer 100 is a spin orbit torque (SOT) material layer used for providing spin orbit torque.

Specifically, when performing the write operation on the magnetic random access memory cell to write data, the write current flows through the entire SOT layer 100, and the SOT layer 100 forms the spin hall effect, so that the spin direction of the adjacent free layer 10 is changed to realize the reversal of the magnetic moment of the free layer 10, thereby completing the "write" operation.

In some implementations, when the magnetic random access memory cell reads data, a read current flows through the magnetic tunnel junction 200 and a part of the SOT layer 100 along a direction perpendicular to the surface of the SOT layer 100, thereby completing the "read" operation.

Therefore, in order to make the magnetic random access memory cell realize the "write" function, a material of the SOT layer 100 is a material that can effectively form the spin hall effect, so that the spin direction of the free layer 10 can be effectively changed, and thereby the magnetic moment of the free layer 10 can be effectively reversed.

Specifically, as an example, the material of the SOT layer 100 may include at least one of tantalum, tungsten, platinum, boron-doped tantalum, platinum-gold alloy, platinum-palladium alloy, bismuth selenide or bismuth antimonide.

In some implementations, the SOT layer 100 is a strip structure extending along the first direction. That is, the extending direction of the SOT layer 100 is the direction of the write current.

In some implementations, the magnetic random access memory cell further includes: a first bottom plug 110, located on a bottom of the SOT layer 100 and contacting one end of the SOT layer 100; and a second bottom plug 120, located on the bottom of the SOT layer 100 and spaced apart from the first bottom plug 110, the second bottom plug 120 contacting the other end of the SOT layer 100, and an arrangement direction of the second bottom plug 120 and the first bottom plug 110 is used for defining the direction of the write current.

The first bottom plug 110 and the second bottom plug 120 are used for realizing electrical connection between the SOT layer 100 and an external circuit or other interconnect structures.

In some implementations, the first bottom plug 110 and the second bottom plug 120 are also used for introducing the write current into the SOT layer 100 to perform the write operation.

A material of the first bottom plug 110 and the second bottom plug 120 is a conductive material.

As an example, the material of the first bottom plug 110 and the second bottom plug 120 may include at least one of Cu, W, Al, TIN, TaN or Ti. In some implementations, the material of the first bottom plug 110 and the second bottom plug 120 is Cu.

In some implementations, the magnetic random access memory cell further includes: a base (not shown), located on the bottom of the SOT layer 100; and a bottom dielectric layer (not shown), located between the base and the SOT layer 100. The first bottom plug 110 and the second bottom plug 120 are located in the bottom dielectric layer.

In some implementations, the base is used for providing a process operation platform for forming the magnetic random access memory cell.

As an example, the base includes a substrate and a functional structure located on the substrate. For example, the functional structure may include semiconductor devices such as MOS transistors, resistance structures, and the like.

As an example, as shown in FIG. 2, the base includes an MOS transistor T on a substrate 300, and the MOS transistor T is used as a cell transistor of the magnetic random access memory cell. The MOS transistor T includes a gate structure 301 located on the substrate 300 in an active area (not shown) and a source/drain doped area 302 located in the substrate 300 on two sides of the gate structure 301.

Besides, the SOT layer 100 respectively contacts the first bottom plug 110 and the second bottom plug 120, and the first bottom plug 110 or the second bottom plug 120 is electrically connected to the source/drain doped area 302 of the MOS transistor T, so that the magnetic random access memory cell is electrically connected to the source/drain doped area 302 of the MOS transistor T, thereby realizing electrical connection between the magnetic random access memory cell and the MOS transistor T.

In some implementations, the source/drain doped area 302 of the MOS transistor Tis electrically connected to the first bottom plug 110. As an example, the source/drain doped area 302 of the MOS transistor T is electrically connected to the first bottom plug 110 through a one-layer or multilayer interconnection structure. In some implementations, the interconnection structure includes a conductive plug 303 and an interconnect layer 304 located on the conductive plug 303 and contacting the conductive plug 303.

The conductive plug 303 contacting the source/drain doped area 302 is used as a source/drain conductive plug (not shown).

A material of the conductive plug 303 and the interconnect layer 304 is a conductive material.

As an example, the material of the conductive plug 303 and the interconnect layer 304 may include at least one of Cu, W, Al, TiN, TaN or Ti. In some implementations, the material of the conductive plug 303 and the interconnect layer 304 is Cu.

The bottom dielectric layer is used for realizing electrical isolation between bottom plugs.

A material of the bottom dielectric layer is an insulating dielectric material. As an example, the material of the bottom dielectric layer may be a low k dielectric material, an ultra-low k dielectric material, silicon oxide, silicon nitride, silicon oxynitride or other dielectric materials.

It should be noted that for the convenience of illustration and description, only the SOT layer 100 and the magnetic tunnel junction 200 are illustrated in the top view.

The magnetic tunnel junction 200 is used for storing data, specifically, by the state of the magnetization direction of the free layer 10 of the magnetic tunnel junction 200.

In some implementations, the magnetic tunnel junction 200 includes the substructures 210 symmetrical with respect to the second direction, and the magnetic moment direction (as shown by the dotted arrow 205 in FIG. 4) of the substructure 210 forms an acute included angle with the first direction, so that the magnetic moment direction of the magnetic tunnel junction 200 contains both a magnetic moment component in the first direction and a magnetic moment component in the second direction. By containing the magnetic moment component in the first direction, it is beneficial to improve the read-write speed of the MRAM. By containing the magnetic moment component in the second direction, the reversal of the magnetic moment of the free layer 10 in the magnetic tunnel junction 200 can be realized simply by using the SOT layer 100 without an external magnetic field.

Based on the above, the magnetic random access memory cell provided by some implementations not only improves the read-write speed of the MRAM, but also realizes the reversal of the magnetic moment of the free layer 10 in the magnetic tunnel junction 200 without an external magnetic field, which contributes to the production and application of the MRAM, simplifies the structure of the MRAM and improves the performance of the MRAM.

Referring to FIG. 1, in some implementations, the magnetic tunnel junction 200 includes the substructures 210 symmetrical with respect to the second direction, and one ends of the substructures 210 away from each other are bent toward the second direction.

Specifically, the direction of the magnetic moment is usually related to the shape of a ferromagnet, and the direction of the magnetic moment is usually along a long axis direction of the ferromagnet. When a thickness of the ferromagnet is extremely small, the direction of the magnetic moment of the ferromagnet is usually along a direction perpendicular to the surface of a ferromagnet layer.

In some implementations, one ends of the two substructures 210 of the magnetic tunnel junction 200 away from each other are bent toward the second direction, so that the magnetic moment of the magnetic tunnel junction 200 can be along a bending direction of the magnetic tunnel junction 200, i.e., along a long axis direction of the magnetic tunnel junction 200, and thereby, the magnetic moment of the magnetic tunnel junction 200 can form an acute included angle with the direction of the write current (i.e., the first direction).

Besides, in some implementations, since one ends of the two substructures 210 of the magnetic tunnel junction 200 away from each other are bent toward the second direction and two magnetic poles of the magnetic tunnel junction 200 are located on one ends of the substructures 210 away from each other, a distance between the two magnetic poles of the magnetic tunnel junction 200 is shorter than that of the magnetic tunnel junction 200 having a spindle-shaped structure, which thereby is beneficial to improve the stability of magnetic induction lines of the magnetic tunnel junction 200 and accordingly improve the stability of the magnetic tunnel junction 200.

As an example, the top view pattern of the magnetic tunnel junction 200 may be a horseshoe-shaped or cashew-shaped structure. In some implementations, the magnetic tunnel junction 200 includes: a free layer 10, a tunneling barrier layer 20 located on the free layer 10, and a pinned layer 30 located on the tunneling barrier layer 20.

In some implementations, the top view patterns of the free layer 10, the tunneling barrier layer 20 and the pinned layer 30 are the same, which facilitates patterning of the magnetic tunnel junction 200 and further facilitates the production and manufacture of the magnetic tunnel junction 200.

In other implementations, the top view patterns of the free layer 10, the tunneling barrier layer 20 and the pinned layer 30 may be different.

The free layer 10 has a free magnetization direction. Specifically, the magnetization direction of the free layer 10 can rotate freely. The magnetization direction of the free layer 10 has two stable orientations, parallel or antiparallel to the magnetization direction of the pinned layer 30 respectively, so that the magnetic tunnel junction 200 can be in a low resistance state or a high resistance state. In some implementations, a material of the free layer 10 is a ferromagnetic material, for example, CoFeB or CoFe.

The pinned layer 30 has a fixed magnetization direction, and thus, can be used as a reference layer for the magnetization direction of the free layer 10.

In some implementations, a material of the pinned layer 30 is also a ferromagnetic material, for example, CoFeB or CoFe. The tunneling barrier layer 20 is used for isolating the free layer 10 from the pinned layer 30.

A material of the tunneling barrier layer 20 is an insulating dielectric material. In some implementations, the material of the tunneling barrier layer 20 is MgO.

In other implementations, the material of the tunneling barrier layer may alternatively be SrO, BaO, RaO, $SiO_2$, $Al_2O_3$, $HfO_2$, NiO, GdO, $Ta_2O_5$, $MoO_2$, $TiO_2$ or $WO_2$.

In some implementations, the magnetic random access memory cell further includes: a top plug 130, located on a top of the magnetic tunnel junction 200 and electrically connected to the magnetic tunnel junction 200.

The top plug 130 is used for electrical connection to an external circuit (e.g., a bit line). In a specific implementation, the top plug 130 is also used for introducing a read current into the magnetic tunnel junction 200 to perform a read operation on the magnetic tunnel junction 200.

In some implementations, a material of the top plug 130 is Cu. In other implementations, the material of the top plug may alternatively be Al, W or other conductive materials.

In other implementations, a top electrode layer may alternatively be formed on the top of the magnetic tunnel junction. The top plug is located on the top electrode layer and contacts the top electrode layer, so that the top plug is electrically connected to the magnetic tunnel junction through the top electrode layer.

In some implementations, the magnetic random access memory cell further includes: a top dielectric layer (not shown), covering the SOT layer 100 and the magnetic tunnel junction 200. The top plug 130 is located in the top dielectric layer.

The top dielectric layer is used for realizing electrical isolation between the top plugs 130. In some implementations, a material of the top dielectric layer is an insulating dielectric material.

The material of the top dielectric layer may be a low k dielectric material, an ultra-low k dielectric material, silicon oxide, silicon nitride, silicon oxynitride or other dielectric materials. As an example, the material of the top dielectric layer is silicon oxide.

In some implementations, the magnetic random access memory cell further includes: a top line 140, located in the top dielectric layer on the top of the top plug 130 and contacting the top plug 130.

The top line 140 is used for realizing electrical connection between the top plug 130 and an external circuit.

In some implementations, a material of the top line 140 is Cu. In other embodiments, the material of the top line may alternatively be Al, W or other conductive materials.

As an example, the top line 140 forms an integrated structure with the top plug 130. In other implementations, the top line may not form an integrated structure with the top plug.

Accordingly, the disclosure further provides a magnetic random access memory.

In some implementations, the magnetic random access memory includes: a plurality of magnetic random access memory cells provided by embodiments and implementations of the disclosure that are arranged in an array.

As can be seen from the above, in the magnetic random access memory cell provided by embodiments and implementations of the disclosure, the magnetic tunnel junction includes the substructures symmetrical with respect to the second direction, and the magnetic moment direction of the substructure forms an acute included angle with the first direction, so that the magnetic moment direction of the magnetic tunnel junction contains both a magnetic moment component in the first direction and a magnetic moment component in the second direction. By containing the magnetic moment component in the first direction, it is beneficial to improve the read-write speed of the MRAM. By containing the magnetic moment component in the second direction, the reversal of the magnetic moment of the free layer in the magnetic tunnel junction can be realized simply by using the SOT layer without an external magnetic field.

Therefore, by making the magnetic random access memory of some implementations include a plurality of magnetic random access memory cells provided by the embodiments of the disclosure that are arranged in an array, the read-write speed of the MRAM is improved, and the reversal of the magnetic moment of the free layer in the magnetic tunnel junction is realized without an external magnetic field, which contributes to the production and application of the MRAM, simplifies the structure of the MRAM and improves the performance of the MRAM.

For a detailed description of the magnetic random access memory cell, reference may be made to the corresponding description in the foregoing embodiments and implementations, as details will not be repeated here in this embodiment.

Although the disclosure has been disclosed above, the disclosure is not limited thereto. Any person skilled in the art can make various changes and modifications without departing from the spirit and scope of the disclosure, so the scope of protection of the disclosure shall be subject to the scope defined by the claims.

What is claimed is:

1. A magnetic random access memory cell, comprising:
    a spin-orbit torque (SOT) layer, through which a write current flows when performing a write operation on the magnetic random access memory cell, a direction of the write current being a first direction, and a direction parallel to the SOT layer and perpendicular to the first direction being a second direction; and
    a magnetic tunnel junction, located on the SOT layer, the magnetic tunnel junction comprising substructures symmetrical with respect to the second direction, where a magnetic moment direction of the substructure forms an acute included angle with the first direction.

2. The magnetic random access memory cell according to claim 1, wherein the magnetic tunnel junction comprises the substructures symmetrical with respect to the second direction, and one ends of the substructures away from each other are bent toward the second direction.

3. The magnetic random access memory cell according to claim 1, wherein the magnetic random access memory cell further comprises:
    a first bottom plug, located on a bottom of the SOT layer and contacting one end of the SOT layer; and
    a second bottom plug, located on the bottom of the SOT layer and spaced apart from the first bottom plug, the second bottom plug contacting the other end of the SOT layer, and an arrangement direction of the second bottom plug and the first bottom plug being used for defining the direction of the write current.

4. The magnetic random access memory cell according to claim 3, wherein the SOT layer is a strip structure extending along the first direction.

5. The magnetic random access memory cell according to claim 3, wherein the magnetic random access memory cell further comprises:
    a base, located on the bottom of the SOT layer; and
    a bottom dielectric layer, located between the base and the SOT layer, the first bottom plug and the second bottom plug being located in the bottom dielectric layer.

6. The magnetic random access memory cell according to claim 1, wherein the magnetic random access memory cell further comprises: a top plug, located on a top of the magnetic tunnel junction and electrically connected to the magnetic tunnel junction.

7. The magnetic random access memory cell according to claim 6, wherein the magnetic random access memory cell further comprises: a top dielectric layer, covering the SOT layer and the magnetic tunnel junction, the top plug being located in the top dielectric layer.

8. The magnetic random access memory cell according to claim 1, wherein a material of the SOT layer comprises at least one of tantalum, tungsten, platinum, boron-doped tantalum, platinum-gold alloy, platinum-palladium alloy, bismuth selenide or bismuth antimonide.

9. The magnetic random access memory cell according to claim 1, wherein the magnetic tunnel junction comprises:
    a free layer,
    a tunneling layer located on the free layer, and
    a pinned layer located on the tunneling layer.

10. A magnetic random access memory, comprising:
    a plurality of magnetic random access memory cells arranged in an array,
    wherein the magnetic random access memory cell comprises:
        a spin-orbit torque (SOT) layer, through which a write current flows when performing a write operation on the magnetic random access memory cell, a direction of the write current being a first direction, and a direction parallel to the SOT layer and perpendicular to the first direction being a second direction; and
        a magnetic tunnel junction, located on the SOT layer, the magnetic tunnel junction comprising substructures symmetrical with respect to the second direction, and a magnetic moment direction of the substructure forming an acute included angle with the first direction.

* * * * *